United States Patent [19]
Saitoh et al.

[11] Patent Number: 5,926,429
[45] Date of Patent: Jul. 20, 1999

[54] SEMICONDUCTOR MEMORY DEVICE AND METHOD OF REFRESHING SEMICONDUCTOR MEMORY DEVICE

[75] Inventors: Tsuyoshi Saitoh, Nagasaki; Kiyoyuki Shiroshima, Hyogo; Michio Nakajima, Tokyo; Masaaki Matsuo, Nagasaki; Nobuyuki Fujii; Akira Kitaguchi, both of Tokyo, all of Japan

[73] Assignees: Mitsubishi Electric System LSI Design Corporation, Hyogo; Mitsubishi Denki Kabushiki Kaisha, Tokyo, both of Japan

[21] Appl. No.: 09/199,050

[22] Filed: Nov. 24, 1998

[30] Foreign Application Priority Data

Jul. 15, 1998 [JP] Japan .................................. 10-200861

[51] Int. Cl.⁶ ....................................................... G11C 7/00
[52] U.S. Cl. ........................ 365/222; 365/225.7; 365/226
[58] Field of Search ................................. 365/222, 225.7, 365/226

[56] References Cited

U.S. PATENT DOCUMENTS

| | | | |
|---|---|---|---|
| 4,849,936 | 7/1989 | Mizutani | 365/222 |
| 5,323,352 | 6/1994 | Miyata et al. | 365/222 |
| 5,627,791 | 5/1997 | Wright et al. | 365/222 |
| 5,805,524 | 9/1998 | Kotani et al. | 365/222 |
| 5,812,475 | 9/1998 | Lee et al. | 365/222 |

FOREIGN PATENT DOCUMENTS 9-190700   7/1997   Japan .
9-282871  10/1997   Japan .

*Primary Examiner*—Trong Phan
*Attorney, Agent, or Firm*—Leydig, Voit & Mayer, Ltd.

[57] ABSTRACT

A semiconductor memory device includes memory elements, each maintaining memory contents within a period of time during which a refresh operation is repeated, and a refresh request circuit for making a refresh request. The semiconductor memory device includes refreshing circuits each of which, in response to a refresh request from the refresh request circuit, performs a refresh operation on a different number of memory elements at the same time, and a selecting circuit for selecting one refreshing circuit from among the refreshing circuits according to the number of memory elements included in the semiconductor memory device. The refresh request circuit can change the interval at which it makes a refresh request.

8 Claims, 5 Drawing Sheets

SEMICONDUCTOR MEMORY DEVICE AND METHOD OF REFRESHING SEMICONDUCTOR MEMORY DEVICE

BACKGROUND OF THE INVENTION

1. Field of the Invention

The present invention relates to a semiconductor memory device including a plurality of memories each of which requires refresh in order to maintain the memory contents therein, and a method of refreshing a semiconductor memory device.

2. Description of the Prior Art

Referring now to FIG. 5, there is illustrated a block diagram showing the structure of a prior art semiconductor memory device. In the figure, reference numeral 1 denotes a semiconductor memory circuit including a plurality of memory elements M1 to Mn, such as DRAMs, each for maintaining the memory contents therein within a time period during which refresh is repeated, 2 denotes a refresh request timer circuit for sending out a refresh request at regular intervals, 3 denotes a refreshing circuit for performing a refreshing operation on the plurality of memory elements M1 to Mn included in the semiconductor memory circuit every time it receives a refresh request from the refresh request timer circuit 2.

Thus, the prior art one-chip semiconductor memory device includes the refreshing circuit 3, the refresh request timer circuit 2, and other electronic circuits (not shown), in addition to the semiconductor memory circuit 1. In order for the plurality of memory elements M1 to Mn, of the semiconductor memory circuit 1, to maintain the memory contents over a certain period of time, a process of refreshing the plurality of memory elements, including a process of reading data from each of the plurality of memory elements and a process of rewriting the data into each of the plurality of memory elements in addition to a process of holding the data stored in each of the plurality of memory elements, is needed.

In a conventional manner, every time the refresh request timer circuit 2 makes a refresh request at fixed intervals, the refreshing circuit 3 refreshes the plurality of memory elements Ml to Mn so as to maintain the memory contents in each of them. The refresh request timer circuit 2 makes a refresh request at fixed intervals which have been determined according to the shortest holding time period among the holding time periods for the plurality of memory elements M1 to Mn, during which the memory contents therein can be maintained. The number of memory elements on which the refreshing circuit 3 can perform a refreshing operation at the same time is set to a constant number n. To be more specific, the number of memory elements on which the refreshing circuit 3 can perform a refreshing operation at the same time has to be maintained constant due to the maximum permissible amount of heat generated by the semiconductor memory circuit 1.

Therefore, since, when the number of the plurality of memory elements built in the semiconductor memory circuit is greater than n, the refreshing circuit 3 cannot perform a refreshing operation on all of them at one time, i.e. at the same time, it has to perform a refreshing operation on all of them at several different times.

Japanese Patent Application Laying Open (KOKAI) No. 9-282871 and No. 9-190700 disclose another prior art refresh request timer circuit that can change intervals at which it makes a refresh request.

A problem with such a prior art semiconductor memory device which is so constructed as mentioned above is that while it can perform a refreshing operation on a plurality of memory elements M1 to Mn, the number of memory elements on which the refreshing circuit 3 can perform a refresh operation at the same time is set to a constant number n. Accordingly, the number of memory elements on which the refreshing circuit 3 can perform a refresh operation at the same time cannot be increased even though the semiconductor memory device includes a low-heat-producing semiconductor memory circuit 1 (for example, when a voltage applied to the semiconductor memory circuit 1 is reduced. In this case, the amount of current flowing through the semiconductor memory circuit 1 is reduced and therefore the amount of heat generated by the semiconductor memory circuit 1 is reduced.)

SUMMARY OF THE INVENTION

The present invention is made to overcome the above problem. It is therefore an object of the present invention to provide a semiconductor memory device and a method of refreshing a semiconductor memory device, capable of increasing the number of memory elements on which it can perform a refreshing operation at the same time while preventing the amount of heat generated by the semiconductor memory circuit from exceeding the maximum permissible amount of heat.

In accordance with one aspect of the present invention, there is provided a semiconductor memory device including a plurality of memory elements each capable of maintaining memory contents therein within a period of time during which refresh is repeated, and a refresh request circuit for making a refresh request, the semiconductor memory device comprising: a plurality of refreshing circuits each capable of, in response to a refresh request from the refresh request circuit, performing a refresh operation on a different number of memory elements at the same time; and a selecting circuit for selecting one refreshing circuit from among the plurality of refreshing circuit according to the number of the plurality of memory elements included in the semiconductor memory device.

Preferably, the refresh request circuit can change intervals at which it makes a refresh request.

In accordance with a preferred embodiment of the present invention, the semiconductor memory device further comprises a voltage measurement circuit for measuring a voltage applied to the plurality of memory elements, and a changing circuit for changing intervals at which a refresh request is made according to the voltage measured by the voltage measurement circuit.

In addition, the semiconductor memory device can comprise a plurality of refresh request circuits each of which can change intervals at which it makes a refresh request. Furthermore, the changing circuit selects one refresh request circuit from the plurality of refresh request circuits according to the voltage measured by the voltage measurement circuit.

In accordance with another aspect of the present invention, there is provided a method of refreshing a plurality of memories built in a semiconductor memory device, which can maintain their memory contents within a period of time during which refresh is repeated, in response to a refresh request, the method comprising the steps of: providing a plurality of refreshing circuits each capable of, in response to a refresh request, performing a refresh operation on a different number of memories at the same time; and selecting one refreshing circuit from among the plurality of refreshing circuits according to the number of the plurality of memories built in the semiconductor memory device.

Preferably, the method further comprises the step of making a refresh request using a timer circuit that can change intervals at which it makes a refresh request.

In accordance with a preferred embodiment of the present invention, the method further comprises the steps of measuring a voltage applied to the plurality of memories, and changing intervals at which a refresh request is made according to the measured voltage.

In addition, the method can comprise the steps of providing a plurality of timer circuits each of which can change intervals at which it makes a refresh request, and selecting one timer circuit from the plurality of timer circuits according to the measured voltage.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
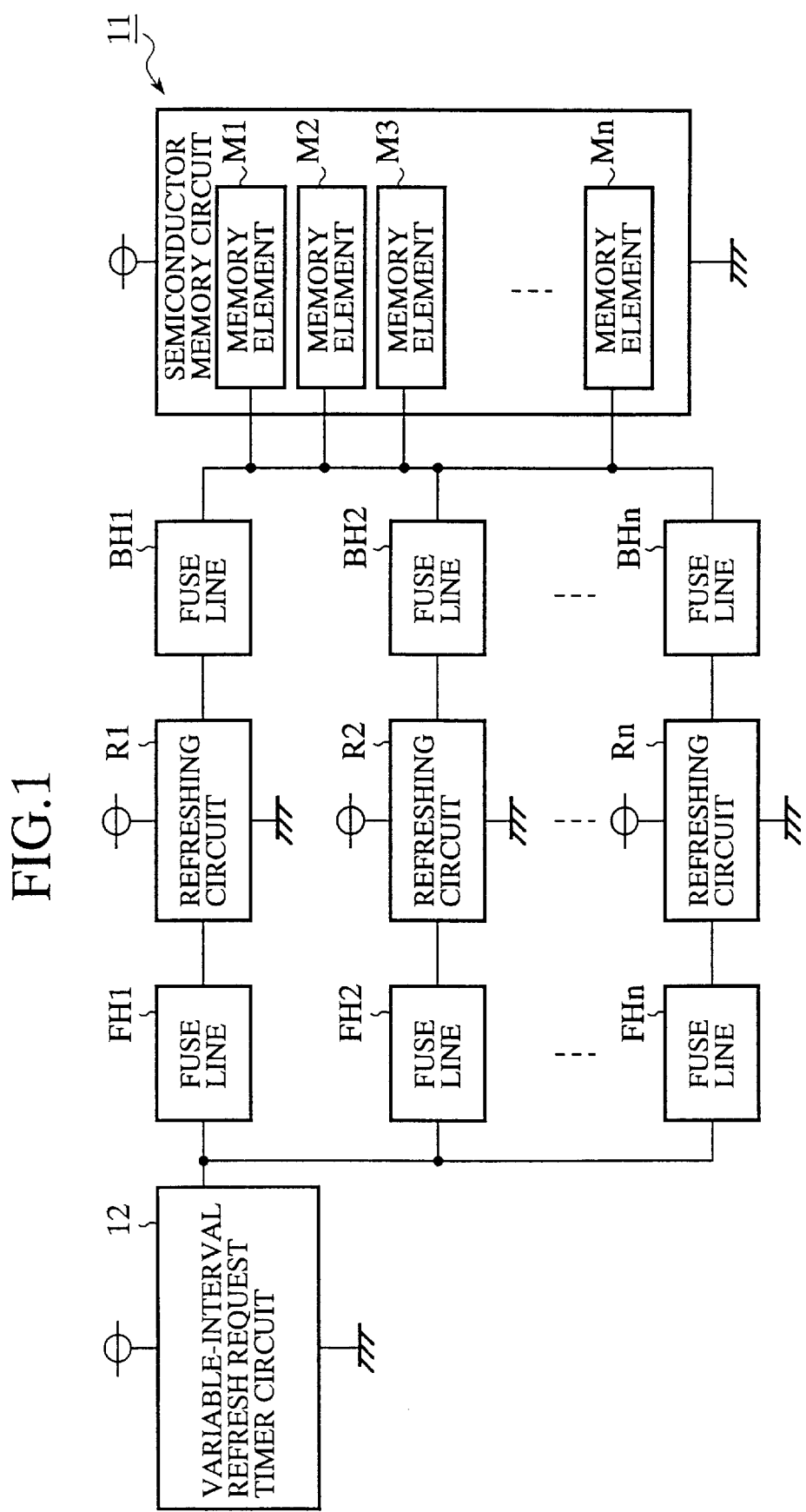
FIG. 1 is a block diagram showing the structure of a semiconductor memory device according to a first embodiment of the present invention.

Referring next to FIG. 1, there is illustrated a block diagram showing the structure of a semiconductor memory device according to a first embodiment of the present invention. In the figure, reference numeral 11 denotes a semiconductor memory circuit including a plurality of memory elements M1 to Mn, such as DRAMs, each capable of maintaining memory contents within a period of time during which refresh is repeated, 12 denotes a variable-interval refresh request timer circuit for sending out a refresh request at predetermined intervals, R1 to Rn denote refreshing circuits each capable of performing a refreshing operation on a different number of memory elements every time it receives a refresh request from the refresh request timer circuit 12, FH1 to FHn denote fuse lines for selecting any one of the plurality of refreshing circuits R1 to Rn, and BH1 to BHn denote fuse lines for selecting any one of the plurality of refreshing circuits R1 to Rn.

Figure 2:
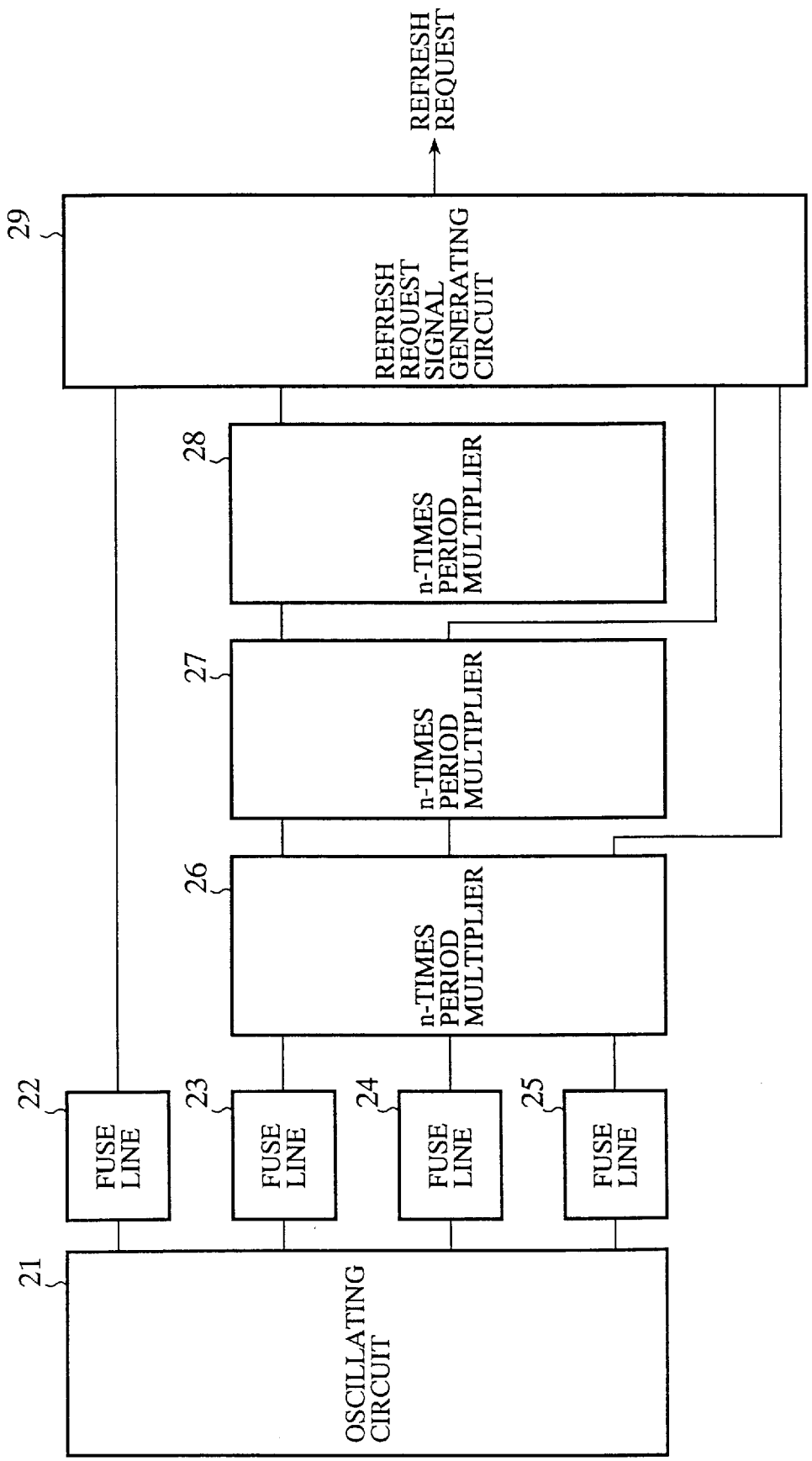
FIG. 2 is a block diagram showing the structure of a variable-interval refresh request timer circuit of the semiconductor memory device according to the first embodiment of the present invention as shown in FIG. 1.

Referring next to FIG. 2, there is illustrated a block diagram showing the structure of the variable-interval refresh request timer circuit 12 as shown in FIG. 1. In the figure, reference numeral 21 denotes an oscillating circuit for generating a clock having a certain pulse repetition period, 22 to 25 denote fuse lines each of which can be broken in order to set intervals at which a refresh request is made, 26 to 28 denote an n-times period multiplier for multiplying the pulse repetition period of the clock generated by the oscillating circuit 21 by n (n is an integer which is equal to or greater than 2), and 29 denotes a refresh request signal generating circuit for generating a clock pulse selected by one of the fuse lines 22 to 25 as a refresh request signal.

Thus, the one-chip semiconductor memory device according to the first embodiment of the present invention is equipped with the plurality of refreshing circuits R1 to Rn, the variable-interval refresh request timer circuit 12, and other electronic circuits (not shown), in addition to the semiconductor memory circuit 11. In order for the plurality of memory elements M1 to Mn of the semiconductor memory circuit 11 to maintain the memory contents, a process of refreshing the plurality of memory elements, including a process of reading data from each of the plurality of memory elements and a process of rewriting the data into each of the plurality of memory elements, in addition to a process of holding the data stored in each of the plurality of memory elements, has to be repeated at predetermined intervals.

Figure 3:
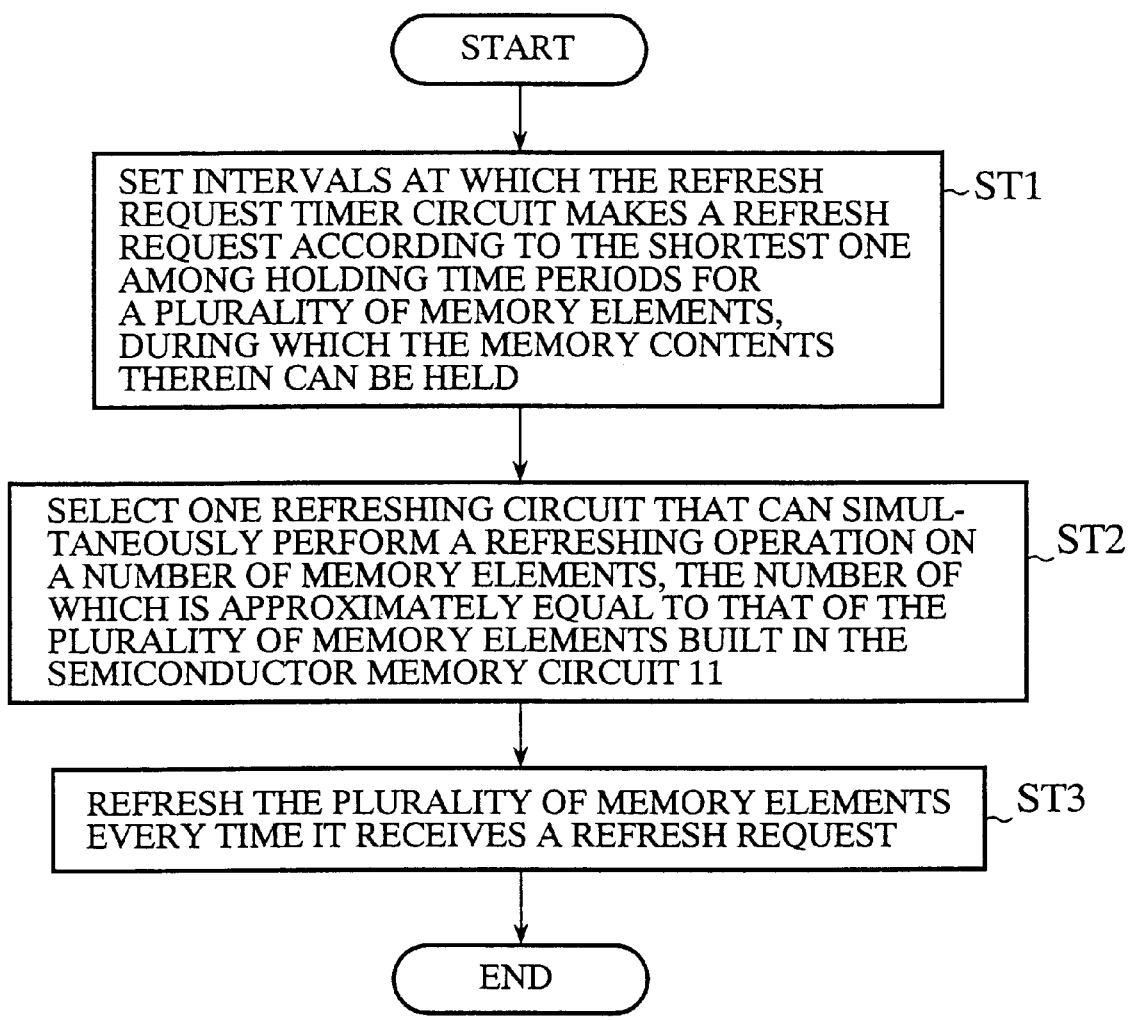
FIG. 3 is a flow diagram showing a method of refreshing a semiconductor memory device according to the first embodiment of the present invention.

Referring next to FIG. 3, there is illustrated a flow diagram showing a method of refreshing the semiconductor memory device according to the first embodiment of the present invention. The semiconductor memory device according to the first embodiment of the present invention predetermines proper intervals at which the variable-interval refresh request timer circuit 12 makes a refresh request in order to reduce the number of times it performs refresh and hence the power consumption in the semiconductor memory circuit 11 (i.e., the amount of heat generated by the semiconductor memory circuit). The semiconductor memory device sets intervals at which the variable-interval refresh request timer circuit 12 makes a refresh request according to the shortest holding time period among holding time periods for the plurality of memory elements M1 to Mn in the semiconductor memory circuit 11, during which the memory contents can be maintained or held, in step ST1. For example, when the shortest holding time period is approximately equal to and is slightly greater than (2n) times the pulse repetition period of the clock from the oscillating circuit 21, a refresh request signal having a period which approximately agrees with the shortest holding time period can be obtained by multiplying the pulse repetition period of the clock generated by the oscillating circuit 21 by (2n). To this end, the fuse lines 22, 23, and 25, but not the fuse line 24, are broken so that only the n-times period multipliers 26 and 27 are activated and the n-times period multiplier 28 is deactivated, as can be seen from FIG. 2. Thus, the refresh request signal generating circuit 29 sends out a clock signal having a pulse repetition period which is (2n) times as large as that of the clock from the oscillating circuit 21 as a refresh request signal.

In order to make sure the refresh is performed without causing an increase in the power consumption in the semiconductor memory circuit 11, i.e., the amount of heat generated by the semiconductor memory circuit 11, the semiconductor memory device, in step ST2, selects one refreshing circuit that can simultaneously perform a refreshing operation on a number of memory elements, the number of which is approximately equal to but greater than that of the plurality of memory elements in the semiconductor memory circuit 11, from among the plurality of refreshing circuits R1 to Rn. In other words, each of the plurality of refreshing circuits R1 to Rn, in the semiconductor memory circuit 11, can perform a refreshing operation on a different number of memory elements at the same time. For example, when the number of memory elements in the semiconductor memory circuit 11 is 5, the semiconductor memory device selects one refreshing circuit that can simultaneously perform a refresh operation on 5 or more memory elements the number of which is closest to but equal to or greater than 5, from among the plurality of refreshing circuits R1 to Rn.

When the semiconductor memory device selects the refreshing circuit R2, for example, the fuse lines FH1, BH1, FHn, and BHn are broken but not the fuse lines FH2 and BH2 so as to enable only the refreshing circuit R2 and disable the other refreshing circuits R1 and Rn. Thus, every time the variable-interval refresh request timer circuit 12 makes a refresh request, the refreshing circuit R2, in step ST3, performs a refresh operation on the plurality of memory elements M1 to Mn.

As can be seen from the above description, since the semiconductor memory device according to the first embodiment of the present invention comprises the plurality of refreshing circuits R1 to Rn, each of which can perform a refreshing operation on a different number of memory elements at the same time, and the plurality of fuse lines for selecting one refreshing circuit from among the plurality of refreshing circuits, the first embodiment offers an advantage of being able to increase the number of memory elements on which it can perform a refreshing operation at the same time while preventing the amount of heat generated by the semiconductor memory circuit from exceeding the maximum permissible amount of heat. In addition, since the semiconductor memory device comprises the variable-interval refresh request timer circuit 12 capable of changing intervals at which it makes a refresh request, the semiconductor memory device can set intervals at which the refresh request timer circuit makes a refresh request according to a holding time period during which the device can maintain the memory contents in all of the plurality of memory elements M1 to Mn. Accordingly, the first embodiment offers another advantage of being able to avoid needless refreshing processes and hence reduce the power consumption in the semiconductor memory device.

Second Embodiment

Figure 4:
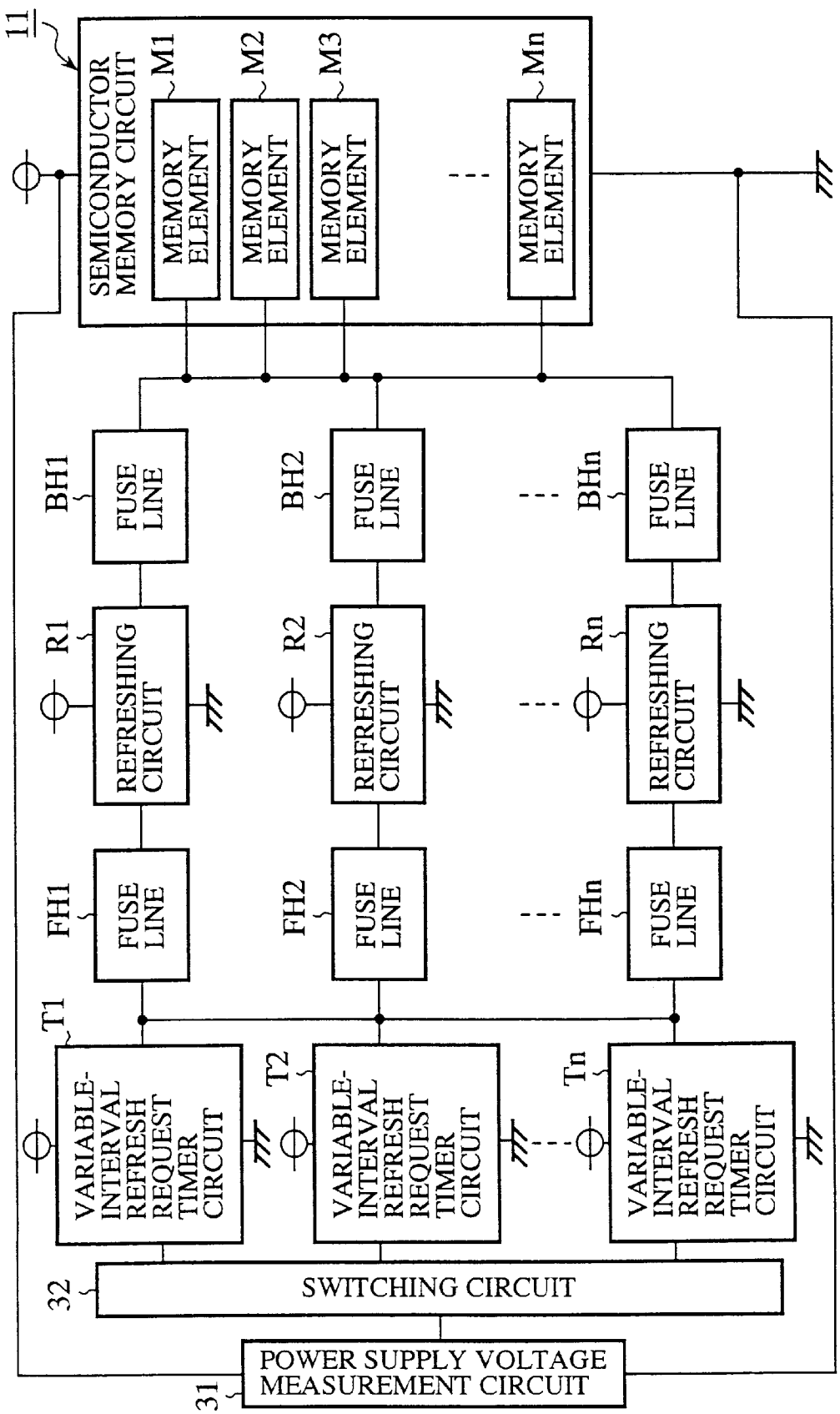
FIG. 4 is a block diagram showing the structure of a semiconductor memory device according to a second embodiment of the present invention.
Figure 5:
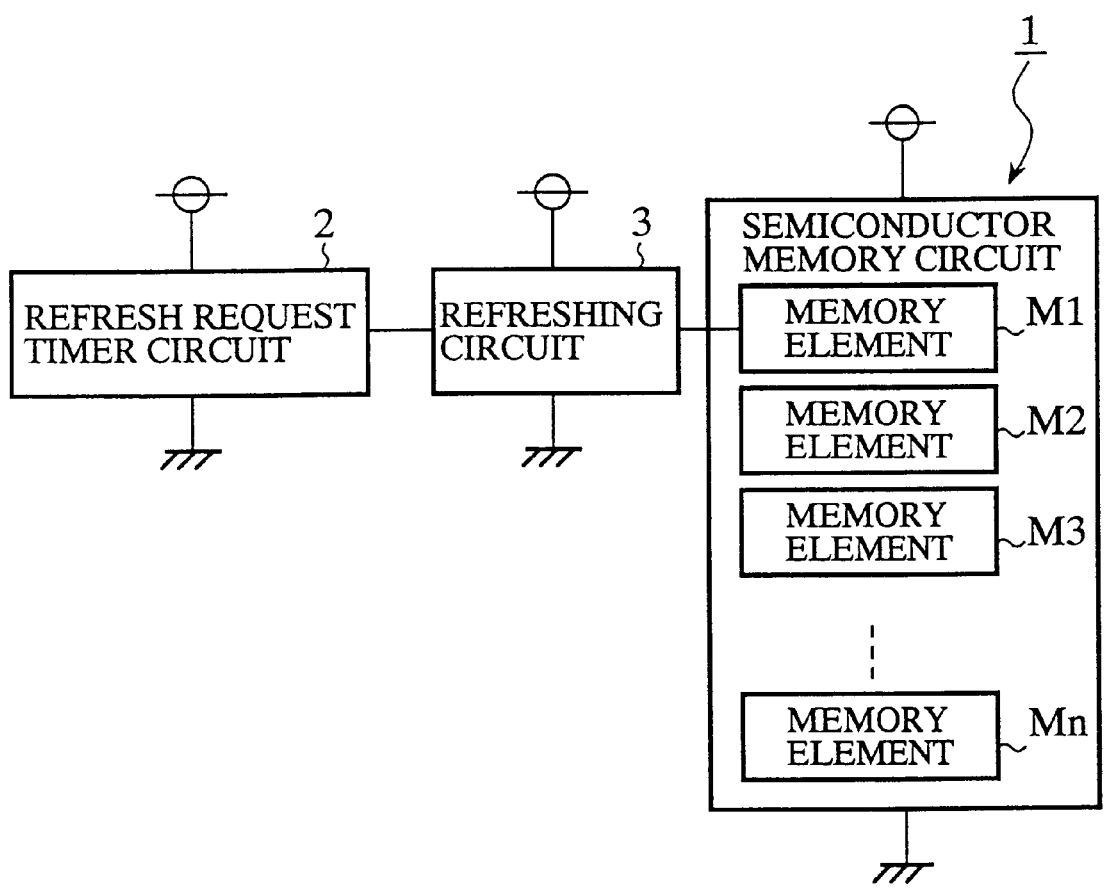
FIG. 5 is a block diagram showing the structure of a prior art semiconductor memory device.

Referring next to FIG. 4, there is illustrated a block diagram showing the structure of a semiconductor memory device according to a second embodiment of the present invention. In the figure, the same reference characters as shown in FIG. 1 denote the same or like elements. Therefore, the description of those elements will is omitted. Reference characters T1 to Tn denote variable-interval refresh request timer circuits for sending out a refresh request signal at predetermined intervals, 31 denotes a power supply voltage measurement circuit for measuring a voltage applied to a semiconductor memory circuit 11, and 32 denotes a switching circuit for selecting one variable-interval refresh request timer circuit from among the plurality of variable-interval refresh request timer circuits according to the voltage measured by the power supply voltage measurement circuit 31.

As previously mentioned, in order for the plurality of memory elements M1 to Mn to maintain the memory contents therein, a refreshing process has to be repeated at predetermined intervals. A voltage, which is hereafter referred to as an operating voltage, applied to each of the plurality of memory elements M1 to Mn when reading data from each memory element and then rewriting the data into each memory element is different from a voltage, which is hereafter referred to as a standby voltage, applied to each of the plurality of memory elements M1 to Mn when holding the data stored in each memory element. The operating voltage is greater than the standby voltage. The lower limit of the operating voltage can be equal to the upper limit of the standby voltage.

Accordingly, when there is no need to read data from each memory element and then rewrite the data into each memory element, the semiconductor memory device does not need to apply a high voltage (i.e. operating voltage) to the plurality of memory elements M1 to Mn and all the semiconductor memory device has to do is to apply a low voltage (i.e. standby voltage) to them. However, when the standby voltage is applied to the plurality of memory elements M1 to Mn, the semiconductor memory device has to perform refresh at shorter intervals as compared with the case where the operating voltage is applied to the plurality of memory elements M1 to Mn.

In order to do so, the semiconductor memory device according to the second embodiment of the present invention measures the voltage applied to the semiconductor memory circuit 11, i.e., the plurality of memory elements M1 to Mn, and determines whether the measured voltage is equal to either the operating voltage or the standby voltage, by means of the power supply voltage measurement circuit 31. The power supply voltage measurement circuit 31 then informs the switching circuit 32 of the determination result.

When the switching circuit 32 receives the determination result from the power supply voltage measurement circuit 31, it selects one variable-interval refresh request timer circuit from among the plurality of variable-interval refresh request timer circuits T1 to Tn. For example, when the first variable-interval refresh request timer circuit T1 can make a refresh request at predetermined intervals intended for the application of the operating voltage and the second variable-interval refresh request timer circuit T2 can make a refresh request at predetermined intervals intended for the application of the standby voltage, the switching circuit 32 selects the first variable-interval refresh request timer circuit T1 if the determination result from the power supply voltage measurement circuit 31 indicates that the measured voltage is equal to the operating voltage. On the other hand, if the determination result from the power supply voltage measurement circuit 31 indicates that the measured voltage is equal to the standby voltage, the switching circuit 32 selects the second variable-interval refresh request timer circuit T2.

As can be seen from the above description, since the semiconductor memory device according to the second embodiment of the present invention comprises the plurality of variable-interval refresh request timer circuits T1 to Tn, each of which can perform a refreshing operation on a different number of memory elements at the same time, and selects one variable-interval refresh request timer circuit from among the plurality of variable-interval refresh request timer circuits according to a voltage applied to the plurality of memory elements M1 to Mn. The second embodiment offers an advantage of being able to maintain the memory contents in the plurality of memory elements M1 to Mn by simply applying a low voltage (i.e., standby voltage) to the plurality of memory elements M1 to Mn, when all that the semiconductor memory device needs to do is to maintain the memory contents in the plurality of memory elements M1 to Mn and therefore it does not need to read data from each of the plurality of memory elements and then rewrite the data into each of the plurality of memory elements. In addition, since the semiconductor memory device comprises the switching circuit 32 for changing intervals at which a refresh request is made according to a voltage applied to the plurality of memory elements M1 to Mn, the second embodiment offers another advantage of being able to apply a certain voltage consistent with a condition for the plurality of memory elements M1 to Mn to the plurality of memory elements.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor memory device including :
    a plurality of memory means, each memory means maintaining memory contents within a period of time during which a refresh operation is repeated;
    refresh request means for making a refresh request;
    a plurality of refreshing means, each refreshing means, in response to a refresh request from said refresh request means, performing a refresh operation on a different number of memory means simultaneously; and
    selecting means for selecting one refreshing means from among said plurality of refreshing means according to the number of memory means included in said semiconductor memory device.

2. The semiconductor memory device according to claim 1, wherein said refresh request means can change intervals at which it makes a refresh request.

3. The semiconductor memory device according to claim 1, comprising voltage measurement means for measuring voltage applied to said plurality of memory means, and changing means for changing intervals at which a refresh request is made in response to the voltage measured by said voltage measurement means.

4. The semiconductor memory device according to claim 3, comprising a plurality of refresh request means, each of said refresh request means having a different interval at which it makes a refresh request, wherein said changing means selects one refresh request means from said plurality of refresh request means in response to the voltage measured by said voltage measurement means.

5. A method of refreshing a plurality of memories in a semiconductor memory device, each memory maintaining memory contents within a period of time during which a refresh operation is repeated, in response to a refresh request, said method comprising:
    providing a plurality of refreshing circuits, each refreshing circuit, in response to a refresh request, performing a refresh operation on a different number of memories simultaneously; and
    selecting one refreshing circuit from among said plurality of refreshing circuits according to the number of memories in said semiconductor memory device.

6. The semiconductor memory device according to claim 5, comprising making a refresh request using a timer circuit changing intervals at which it makes a refresh request.

7. The semiconductor memory device according to claim 5, comprising measuring a voltage applied to said plurality of memories, and changing the interval at which a refresh request is made in response to the measured voltage.

8. The semiconductor memory device according to claim 7, comprising providing a plurality of timer circuits, each timing circuit having a different interval at which it makes a refresh request, and selecting one timer circuit from said plurality of timer circuits in response to the measured voltage.

* * * * *